United States Patent [19]

Bressel et al.

[11] Patent Number: 5,112,513
[45] Date of Patent: May 12, 1992

[54] SOLUTION AND PROCESS FOR ETCHING AND ACTIVATING SURFACES OF A NONCONDUCTIVE SUBSTRATE

[75] Inventors: Burkhard Bressel; Hans-Joachim Grapentin; Detlef Tessmann, all of Berlin, Fed. Rep. of Germany

[73] Assignee: Schering AG, Berlin, Fed. Rep. of Germany

[21] Appl. No.: 349,700

[22] Filed: May 10, 1989

[30] Foreign Application Priority Data

May 10, 1988 [DE] Fed. Rep. of Germany ....... 3816494

[51] Int. Cl.$^5$ ........................... B05D 3/00; B05D 5/00
[52] U.S. Cl. ................................. 252/79.1; 252/79.5; 156/668; 427/307
[58] Field of Search ............................. 252/79.5, 79.1; 156/668; 427/307

[56] References Cited

U.S. PATENT DOCUMENTS

| 4,073,740 | 2/1978 | Polichette et al. | 252/79.5 X |
| 4,601,784 | 7/1986 | Krulik | 156/668 X |
| 4,698,124 | 10/1987 | Krulik | 156/668 X |

Primary Examiner—David A. Simmons
Assistant Examiner—Thi Dang
Attorney, Agent, or Firm—Michael J. Striker

[57] ABSTRACT

An aqueous solution for etching and activating a surface of a nonconductive substrate for subsequent chemical and, if necessary, electrochemical deposition of a metal coating containing both an activator and an etching agent. The activator is a salt or complex compound containing a metal selected from group Ib or group VIII of the periodic table. The etching agent is manganate or permanganate ion. This solution can be used in a shortened process for metallizing isolated surfaces, especially as a part of a process for making electrical connecting elements and circuit boards.

3 Claims, No Drawings

SOLUTION AND PROCESS FOR ETCHING AND ACTIVATING SURFACES OF A NONCONDUCTIVE SUBSTRATE

BACKGROUND OF THE INVENTION

Our invention relates to a solution for etching and activating surfaces of a nonconductive substrate for subsequent chemical and, if necessary, electrochemical deposition of a metallic coating and also to a process for metallizing surfaces of a nonconductive substrate.

Pretreatments of surfaces for subsequent chemical and, if necessary, electrochemical deposition are known. Known etching agents and activators in suitable form are used. These pretreatments are generally performed separately which is time-consuming and expensive (that is, first the etching is performed then in a separate step the activation is performed).

A disadvantage of the chemical process is that a multistep, lengthy process sequence is necessary since the individual chemical process steps perform only certain specialized tasks in regard to the goal to be achieved. Usually a cleaning step is required, which removes loose adhering impurities or dirt. Subsequently the object to be metallized is treated chemically in most cases to make a surface of increased adsorption and to prepare a hydrophilic surface for the same purpose so that the subsequent adsorption of molecules and ions from the watery solution runs advantageously. If the first cleaning step is omitted, a cleaning of the substrate surface occurs by action of the etching agent. After that adsorption promoting substances are applied to the surface to guarantee an anchoring of the catalytic medium and the metal film is built on it. Etching processes provide a satisfactory cleaning of the exposed metal surfaces so that error-free transition to the metal film is possible.

Next the catalytic step required for the autocatalytic metal deposition using noble metal nucleation occurs. For commercial applications in past years two principle types of catalysts with different variations have been developed. In the first process noble metal colloids are used, which wind up on the prepared surfaces stabilized with protective colloids in different ways and serve as starting centers for metal deposition from baths acting autocatalytically. The other system works with noble metal complexes, which also wind up on the prepared surfaces and which are reduced in a second step to the noble metal nuclei which act catalytically.

The entire sequence of pretreatment steps is expensive so that considerable investments must be made for the suitable pretreatment plant. Furthermore the chemicals used must be controlled, observed and subsequently dumped. This demands additional costs. Process monitoring of the extensive process sequences of this kind is necessary to protect against erroneous operation.

Because of the above-mentioned disadvantages it was necessary to develop a shorter process.

SUMMARY OF THE INVENTION

Accordingly, it is an object of our invention to simplify the pretreatment of surfaces of a nonconductive substrate for subsequent metallizing and to reduce particularly the number of subsequent process steps.

In keeping with this object and with others which will become apparent hereinafter, one solution for activating and etching surfaces of a nonconductive substrate containing both an activator and an etching agent is prepared for use in an improved process.

By "activator" we mean a substance which provides noble metal nuclei and attaches them to the surface, so as to catalyze the subsequent autocatalytic metal deposition.

There are several possible embodiments of the etching and activating solution of our invention. The activator may contain one or more compounds of elements containing an element from group Ib or group VIII of the periodic system. These compounds may be present in the form of their salts or complexes. The salts can be selected from the group consisting of nitrates, sulfates, halides, carbonic acid salts and cyano complexes. The etching agent may comprise an oxidizing agent, which advantageously contains permanganate. The etching agent may also be an alkaline permanganate solution. The solution of our invention may also contain one or more compounds with the elements zinc, tin, titanium, aluminum, zirconium, manganese, tungsten and/or molybdenum.

Advantageously the solution of our invention is both an aqueous activating and etching solution. It has an activator concentration of more than 0.01 g/liter (up to the saturation limit) and an etching agent concentration of from more than 5 g/liter up to that in a saturated solution. Advantageously the activator concentration is 1 g/liter.

Also in keeping with the above object and with others which will become apparent hereinafter, in our process for etching and activating the surface activation of the surface required for the autocatalytic metal deposition occurs together with an etching-related treatment of the substrate surface in a single process step. The etching-related treatment can be the etching step itself or the removal of the etching agent used for the etching along with any etching residue present.

Several embodiments of our process are possible. Alkaline permanganate solution can be used as an etching agent. When the etching-related treatment is the etching itself a manganese dioxide coating arising during the etching process can contain activator compounds. The manganese dioxide coating can be left on the surface during subsequent steps. The activator compounds contained in the manganese dioxide coating can be reduced to elements in a subsequent treatment step. Also the activator compounds fixed on the substrate surface may be reduced in a subsequent processing step. The metallization can be performed in an autocatalytic copper bath or a nickel bath.

The process according to our invention combines in an advantageous way the catalytic step with the surface-reaction step required for a optimum metal adherence. Moreover the conditioning sequence containing the adsorption promoting steps can be omitted, since a sufficient attachment of the noble metal nuclei to the surface to be metallized occurs by the simultaneous hydrophilization by the surface-reacting medium.

The working runs then contain the following process steps:
1. Etching and activating
2. Reducing
3. autocatalytic metallizing Step 1 can preceed a precleaning and/or conditioning. After an etching-activation according to our invention—if necessary—a removal of the treatment solution can be added.

This three to six step sequence according to the technical requirements is thus substantially shorter than the conventional sequence, which generally includes at least ten steps.

An additional treatment or process sequence according to our invention is based on the fact that the activation can be combined with the treatment bath following the surface-reaction step for removal of the etching agent and/or etching residue.

Also in this case an extraordinarily short sequence of process steps results. These process steps are as follows:
1. Etching reaction
2. Removing etching agent and etching residue with accompanying simultaneous activation
3. Reducing
4. Autocatalytic metallizing According to our invention in the first named step salts of group Ib or Group VIII of the periodic system or mixtures of those salts are added to the etching agent acting on the surface. It is also possible to use complex compounds of these elements. In the other process sequence the above-mentioned metal compounds are added in the treatment step following the etching step for removal of the remaining etching residue on the substrate surface.

A variety of inorganic or organic salts can be used. These include fluoride, chloride, perchlorate, bromide, bromate, Iodide, sulfate, nitrite, nitrate, phosphate, borate, carbonate, cyanide and other inorganic salts, acetate, formate and higher homologs, sulfamide, sulfonate, phosphonate and other salts of organic acids. Also inorganic and organic complex compounds can be used include fluoro-, chloro-, bromo-, iodo-, nitro-, nitroso-, hydroxo-, cyano-, amine compounds and other inorganic complex salts and organic complexes with oxygen-containing ligands such as carbonic acid, nitrogen-containing ligands such as amines, amidines, imidines, imidazole, pyrrole, pyridine, pyrimidine, quinoline, quinoxaline, indole, pyrazole, pyrazoline, pyrazolone and others and with sulfur containing ligands such as thiol, disulfide, thiazole and others. Similarly complex compounds with unsaturated systems are similarly advantageously useful. Understandably similarly mixtures of these ligands and anions with each other in a metal compound and mixtures of different metal compounds with each other are also useful.

An additional embodiment of our invention results using metal compounds, which form stable oxides and are not reduced to metal in nuclei-forming reduction steps. These metal compounds include compounds of zinc, tin, titanium, aluminum, zirconium, manganese, molybdenum and tungsten among others.

Use of this kind of additive to the activator promotes the adsorption of the activator compound and causes an improved coating thickness with catalyzing nuclei, so that the thicker metal coating with improved adherence, especially on inorganic filling materials in substrate material, for example glass fibers among other mineral particles arises or results.

The activators act according to the etching medium in different ways: Permanganate salts, which are used in alkalai solution in advantageous embodiments, are used advantageously in etching agent. Typical compositions of these etching mediums contain 50 to 70 g/l $KMnO_4$, 40-100 g/l NaOH, 10-20 g/l $K_2MnO_4$ and additional stabilizers, wetting agents(fluoride) and regenerators, although an electrolytic regeneration of the used permanganate does not occur. Alternatively for example also $NaMnO_4$ or other salts of permanganate ions can be used. Advantageously these compounds have an improved solubility, which leads to a vigorous etching in connection with alkalai.

The activating metal compounds in these solutions and adhering-agent metal compounds are present probably in the above-described sense according to the kind of metal dissolved as hydroxocomplexes, as a metal oxide-hydroxide solution or as a mixture with inorganic ligands. During the etching reaction on the base substrate an adhering manganese oxide film is formed on the substrate surface from the $KMnO_4$ solution, in which the activator compound is present.

The manganese oxide film formed is not removed from the surface and reaches the reductor after eventual etching cleaning of exposed metal surfaces, where the deposited compounds of the first and eighth groups of the periodic system are reduced to metal nuclei, which act catalytically.

Acid reducing solution are to be avoided at this point so that the now noble-metal-activated Manganese oxide film acts catalytically. Advantageously alkaline reducing agents are used, e.g. containing boron-hydrogen compounds such as $NaBH_4$, dialkaylamine borane and others.

To intensify the etching reaction a conditioning step can be used at the beginning of the process, for example with an organic solvent, which swells the substrate.

In connection with the eventually performed etching cleaning of the exposed metal surfaces the formation of catalytically-acting noble metal nuclei by reduction and after that the autocatalytic metal deposition occurs.

The autocatalytic metallizing occurs in all cases with known metallizing baths. Copper, nickel, palladium, gold or other baths may be used.

As materials with isolating surfaces plastics can be used such as Duroplastic, epoxy resin, polyimide, melamine formaldehyde, phenol formaldehyde, urea-formaldehyde and thermoplastic resin, polycarbonate, polyvinyl chloride, polyether imide and polyethersulfone, polysulfone, polyether ketone, polymethacrylate, polyethylene and polypropylene, polyamide, polystyrene, polyvinyl acetate and others.

Furthermore derivatives, copolymers and mixtures of the above-mentioned polymers and compounds can be used in our invention. Also unfilled and filled materials, such as those filled with fiber glass can be used. Materials such as molded bodies, granulated bodies and inner or outer metal foils can be used.

The manufacture of electronic circuit boards is one application of our invention. In this case the circuit boards are made advantageously from perforated epoxy resin boards with fiber glass supporting a copper foil. These circuit boards can also support additional copper inner layers for making a multilayer circuit. The aim of the metallization is above all to attain a metallic coating of the perforated wall. Understandably supporting plates or three dimensional molded bodies can be used.

The following examples illustrate our invention, but should not be construed as limiting the scope of the appended claims.

EXAMPLES

Example 1

An epoxy resin/fiber glass-laminate with epoxy resin surfaces is subjected to the following treatment:

| | |
|---|---|
| 1. Conditioning: N-methyl pyrrolidone | 5 min. 40° C. |
| 2. Etching activation:<br>   0.5 g/l AgNO$_3$<br>   60 g/l KMnO$_4$<br>   15 g/l K$_2$MnO$_4$<br>   30 g/l NaOH<br>   0.5 g/l of a fluorinated wetting agent | 15 min. 70° C. |
| 3. Reducing<br>   1 g/l NaBH$_4$, 1 g/l NaOH | 5 min. RT |
| 4. Autocatalytic copper plating<br>   in a commercial dilute copper bath | 15 min. 28° C. |

A rinsing is performed between the individual steps. One obtains a dark, very thin copper deposit on the entire surface.

Example 2

The same as Example 1, using 0.5 g/l Pd(NO$_3$)$_2$ instead of AgNO$_3$. One obtains a thick spotted deposit.

Example 3

The metallizing of a perforated copper-supporting circuit board made of an epoxy resin. Fiber glass laminate using experimental conditions stated in Example 2 results in a good coating of copper on the perforation hole inner wall. The metallizing on the copper support is salmon colored and adheres firmly.

In this case an additional etching cleaning step with a commercial etching cleaner based on Na$_2$S$_2$O$_8$ is added between steps 2 and 3 to free the copper support of oxide layers.

Example 4

The same as Example 1, but with 0.50 g/l ZnO added to the etching activating solution. The deposited precipitate or deposit is entirely uniform over the surface and is salmon colored. Small bubbles do occur at isolated locations.

Example 5

The same as Example 1, but with 0.50 g/l SnSO$_4$ added to the etching activating solution.

One obtains a lusterous, adherent, uniform copper deposit of a salmon-red color.

Example 6

The same as Example 1, but with addition of 0.5 g/l Na[Ag(CN)$_2$] instead of AgNO$_3$:

The copper deposit is substantially thicker than that of Example 1. It is lusterous, adherent and has a salmon-red color.

A good rinse is performed between the individual steps. An epoxy resin/fiber glass laminate was treated in the present way.

One obtains a red to salmon-red lusterous copper deposit, which adheres extremely firmly to the base material.

It will be understood that each of the elements described above, or two or more together, may also find a useful application in other types of constructions differing from the types described above.

While the invention has been illustrated and described as embodied in a solution and process for etching and activating surfaces of a nonconductive substrate it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of the prior art, fairly constitute essential characteristics of the generic or specific aspects of this invention.

What is claimed as new and desired to be protected by Letters Patent is set forth in the appended claims.

1. An aqueous solution for etching and activating a surface of a nonconductive substrate, said aqueous solution consisting essentially of both an activator and an etching agent and being used to prepare said surface for subsequent deposition of a metal coating, the subsequent deposition including chemical deposition, wherein said activator consists essentially of at least one compound selected from the group consisting of salts containing a metal from groups Ib and VIII of the periodic table and cyanocomplexes containing a metal from groups Ib and VIII of the periodic table and said etching agent is selected from the group consisting of aqueous akaline solutions of manganate ion, aqueous alkaline solutions of permanganate ion and mixtures thereof, wherein said salts are selected from the group consisting of nitrates, sulfates and halides.

2. A solution according to claim 1 also contains at least one other compound containing an element selected from the group consisting of zinc, tin, titanium, aluminum, zirconium, tungsten and molybdenum.

3. An aqueous solution according to claim 1, in which said activator is present in a concentration of from 0.01 g/l to 1.0 g/l and said etching agent consists of said aqueous alkaline permanganate solution having a permanganate concentration of from 5 g/l to saturation limit.

\* \* \* \* \*